United States Patent
Guo et al.

(10) Patent No.: US 10,629,234 B1
(45) Date of Patent: Apr. 21, 2020

(54) DATA STORAGE DEVICE COMPUTING NOTCH FILTERS FOR MULTIPLE TEMPERATURES

(71) Applicant: Western Digital Technologies, Inc., San Jose, CA (US)

(72) Inventors: Hengchang Guo, Rancho Santa Margarita, CA (US); Tetsuo Ueda, Kanagawa (JP); Chuanwen Ji, Irvine, CA (US); Alexander Babinski, Laguna Niguel, CA (US); Shinsuke Nakagawa, Ibaraki (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/454,376

(22) Filed: Jun. 27, 2019

(51) Int. Cl.
*G11B 5/09* (2006.01)
*G11B 5/596* (2006.01)
*G06F 17/17* (2006.01)
*G11B 5/55* (2006.01)

(52) U.S. Cl.
CPC .......... *G11B 5/59622* (2013.01); *G06F 17/17* (2013.01); *G11B 5/5565* (2013.01)

(58) Field of Classification Search
None
See application file for complete search history.

(56) References Cited

U.S. PATENT DOCUMENTS

| | | | | |
|---|---|---|---|---|
| 5,742,568 A * | 4/1998 | Nakano | ............. | G11B 7/08505 369/44.32 |
| 6,188,191 B1 * | 2/2001 | Frees | ................... | G11B 5/5547 318/560 |
| 6,574,065 B1 * | 6/2003 | Sri-Jayantha | ...... | G11B 5/59605 360/75 |
| 6,798,604 B1 * | 9/2004 | Kamimura | ........... | G11B 5/5547 360/75 |
| 7,864,482 B1 * | 1/2011 | Babinski | .............. | G11B 5/5534 360/31 |
| 10,366,718 B1 | 7/2019 | Supino | | |
| 2008/0285170 A1 * | 11/2008 | Uchida | .................. | G01H 1/003 360/77.02 |
| 2009/0323215 A1 * | 12/2009 | Ueda | .................... | G11B 5/5565 360/75 |

* cited by examiner

*Primary Examiner* — Peter Vincent Agustin

(57) ABSTRACT

A data storage device is disclosed comprising a head actuated over the disk. A first notch filter is calibrated at a first temperature, and a second notch filter is computed for a second temperature based on the first notch filter and a first delta temperature between the first temperature and the second temperature. The second notch filter is computed by transforming a continuous-time transfer function of the first notch filter adjusted by the first delta temperature into a discrete-time transfer function of the second notch filter.

17 Claims, 5 Drawing Sheets

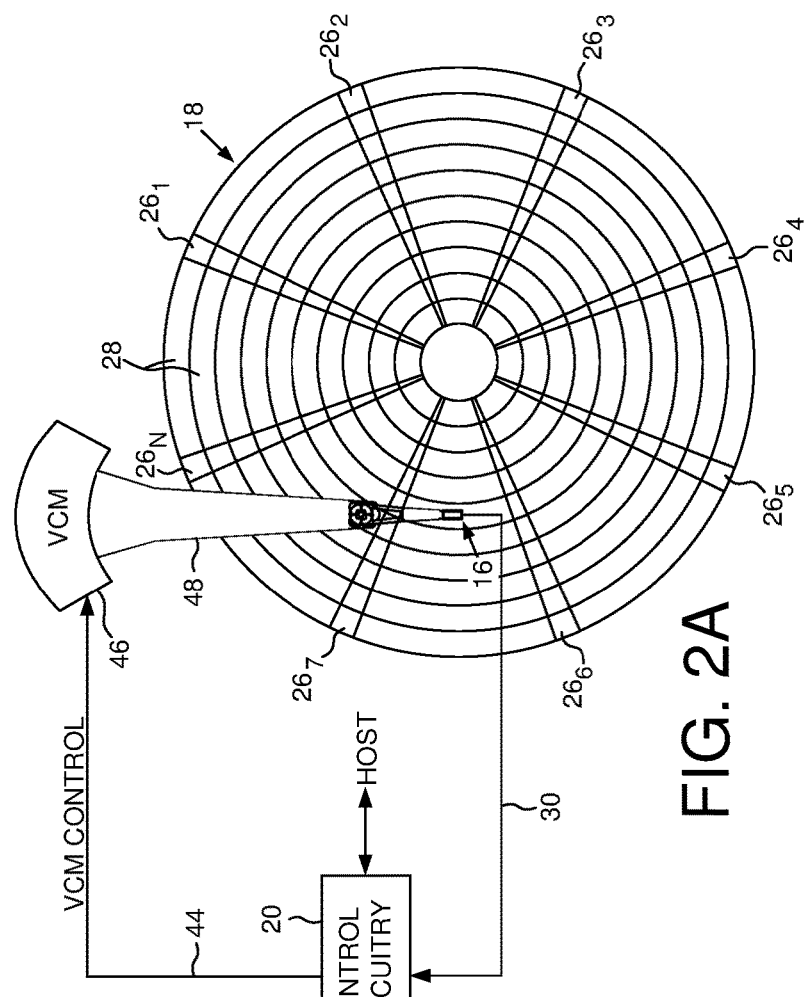
FIG. 2A
FIG. 2B
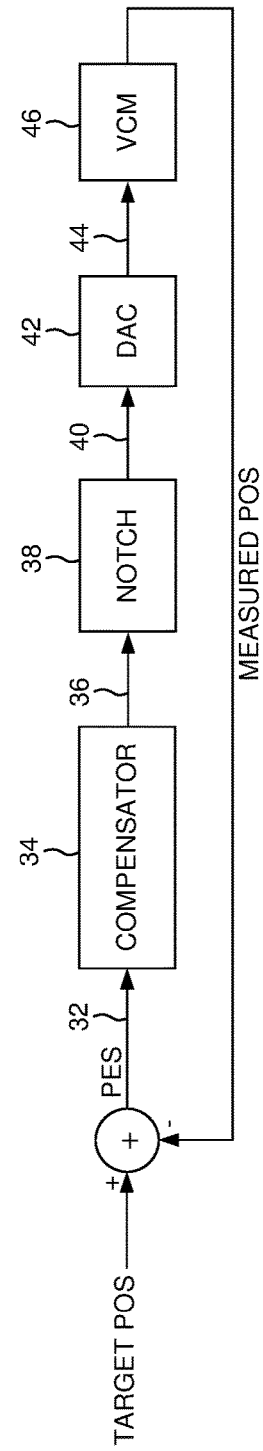
FIG. 2C $$\frac{s^2 + 2\omega_n \delta_n s + \omega_n^2}{s^2 + 2\omega_d \delta_d s + \omega_d^2}$$

FIG. 3A $$\frac{1 + b_1 z^{-1} + b_2 z^{-2}}{1 + a_1 z^{-1} + a_2 z^{-2}}$$

FIG. 3B $\alpha_n + j\beta_n$, $\alpha_n - j\beta_n$ and
$\alpha_d + j\beta_d$, $\alpha_d - j\beta_d$

FIG. 3C $b0 = 1.0$; $b1 = -2e^{T\alpha_n} \cos\beta_n$; $b2 = e^{T\alpha_n}$
$a0 = 1.0$; $a1 = -2e^{T\alpha_d} \cos\beta_d$; $a2 = e^{T\alpha_d}$

FIG. 3D

DCGain = $(a0+a1+a2)/(b0+b1+b2)$
$b0 = b0$*DCGain;
$b1 = b1$*DCGain;
$b2 = b2$*DCGain;

FIG. 3E

DATA STORAGE DEVICE COMPUTING NOTCH FILTERS FOR MULTIPLE TEMPERATURES

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

A disk drive typically comprises a plurality of disks each having a top and bottom surface accessed by a respective head. That is, the VCM typically rotates a number of actuator arms about a pivot in order to simultaneously position a number of heads over respective disk surfaces based on servo data recorded on each disk surface. FIG. 1 shows a prior art disk format 2 as comprising a number of servo tracks 4 defined by servo sectors $6_0$-$6_N$ recorded around the circumference of each servo track. Each servo sector $6_i$ comprises a preamble 8 for storing a periodic pattern, which allows proper gain adjustment and timing synchronization of the read signal, and a sync mark 10 for storing a special pattern used to symbol synchronize to a servo data field 12. The servo data field 12 stores coarse head positioning information, such as a servo track address, used to position the head over a target data track during a seek operation. Each servo sector $6_i$ further comprises groups of servo bursts 14 (e.g., N and Q servo bursts), which are recorded with a predetermined phase relative to one another and relative to the servo track centerlines. The phase based servo bursts 14 provide fine head position information used for centerline tracking while accessing a data track during write/read operations. A position error signal (PES) is generated by reading the servo bursts 14, wherein the PES represents a measured position of the head relative to a centerline of a target servo track. A servo controller processes the PES to generate a control signal applied to a head actuator (e.g., a voice coil motor) in order to actuate the head radially over the disk in a direction that reduces the PES.

BRIEF DESCRIPTION OF THE DRAWINGS

FIG. 2A shows a data storage device in the form of a disk drive according to an embodiment comprising a head actuated over a disk by a voice coil motor (VCM).

FIG. 2B is a flow diagram according to an embodiment, wherein a first notch filter is calibrated at a first temperature, and a second notch filter is computed for a second temperature based on the first notch filter and a first delta temperature between the first temperature and the second temperature.

FIG. 2C shows a closed loop control system including a notch filter for controlling the VCM according to an embodiment.

FIG. 3A shows a continuous-time transfer function of a notch filter according to an embodiment.

FIG. 3B shows a discrete-time transfer function of a notch filter transformed from the continuous-time notch filter of FIG. 3A.

FIG. 3C shows two roots of the numerator and two roots of the denominator of the continuous-time transfer function of FIG. 3A.

FIG. 3D shows a computation of the coefficients of the discrete-time transfer function of FIG. 3B based on the roots of FIG. 3C.

FIG. 3E shows a computation for a gain of the discrete-time transfer function of FIG. 3B.

DETAILED DESCRIPTION

Figure 1:
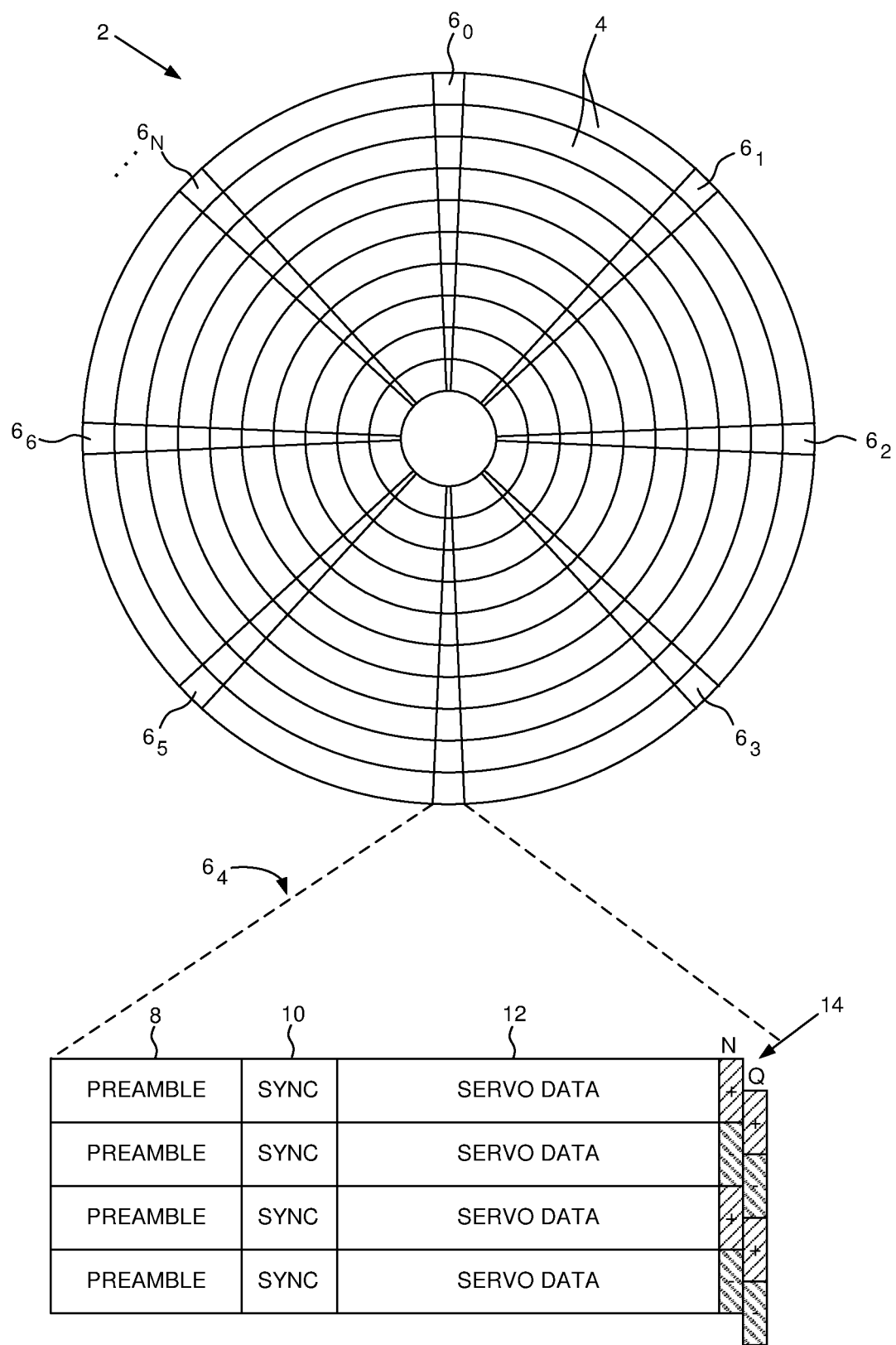
FIG. 1 shows a prior art disk format comprising a plurality of servo tracks defined by servo sectors.

FIG. 2A shows a data storage device in the form of a disk drive according to an embodiment comprising a head 16 actuated over the disk 18. The disk drive further comprises control circuitry 20 configured to execute the flow diagram of FIG. 2C, wherein a first notch filter is calibrated at a first temperature (block 22), and a second notch filter is computed for a second temperature based on the first notch filter and a first delta temperature between the first temperature and the second temperature (block 24). As described in the embodiments below, the second notch filter is computed by transforming a continuous-time transfer function of the first notch filter adjusted by the first delta temperature into a discrete-time transfer function of the second notch filter.

In the embodiment of FIG. 2A, the disk 18 comprises a plurality of servo sectors 261-26N that define a plurality of servo tracks, wherein data tracks 28 are defined relative to the servo tracks at the same or different radial density. The control circuitry 20 comprises a closed loop control system such as shown in FIG. 2C which processes a read signal 30 emanating from the head 16 to demodulate the servo sectors and generate a position error signal (PES) 32 representing an error between the actual position of the head and a target position relative to a target track. A suitable compensator 34 filters the PES 32 to generate a compensated control signal 36. A target frequency of the closed loop control system (e.g., a resonant frequency) is attenuated by filtering the compensated control signal 36 with a notch filter 38. The output 40 of the notch filter 38 is converted into an analog control signal 44 by a digital-to-analog converter (DAC) 42. The analog control signal 44 is applied to a VCM 46 which rotates an actuator arm 48 about a pivot in order to actuate the head radially over the disk surface in a direction that reduces the PES. In one embodiment, the head 16 may be actuated over the disk 18 based on the PES using one or more secondary actuators, for example, a microactuator that actuates a suspension coupling a head slider to the actuator arm 48, or a microactuator that actuates the head slider relative to the suspension (e.g., using a thermal actuator, piezoelectric actuator, etc.). The servo sectors 26₁-26N may comprise any suitable head position information, such as a track address for coarse positioning and servo bursts for fine positioning. The servo bursts may comprise any suitable pattern, such as an amplitude based servo pattern or a phase based servo pattern (FIG. 1).

In one embodiment, the closed loop control system such as shown in FIG. 2C may comprise multiple notch filters, each configured to attenuate a target frequency (or frequency band) in the closed loop frequency response. For example, in one embodiment each target frequency may correspond to a different resonant frequency of the closed loop control system. In addition the target frequencies may vary between the heads of a multiple disk surface disk drive, and so in one embodiment the multiple notch filters of the closed loop control system may be configured using multiple sets of coefficients each corresponding to a different head. These multiple sets of coefficients corresponding to multiple notch filters at different frequencies for each head may be further multiplied due to characteristics of the target frequencies (e.g., resonant frequencies) shifting with temperature. That is, in one embodiment the multiple sets of notch filter coefficients for each head may need further adjusting to compensate for variations of the target frequencies due to changes in temperature.

In one embodiment, a calibration notch filter is calibrated at a calibration temperature, and then multiple sets of notch filters are computed for each head across multiple temperatures. Any suitable technique may be employed to calibrate the calibration notch filter at the calibration temperature, such as the embodiments disclosed in U.S. Pat. No. 7,864,482 entitled "DISK DRIVE CALIBRATING VCM NOTCH FILTER BY INCREASING THE WIDTH AND/OR DEPTH OF THE NOTCH FILTER," the disclosure of which is incorporated herein by reference. In one embodiment, the calibration notch filter may be calibrated by adjusting coefficient of a discrete-time transfer function such as in the above reference U.S. Patent, and then the discrete-time transfer function transformed into a continuous-time transfer function such as shown in FIG. 3A. In the embodiment of FIG. 3A, frequencies $\omega_n$ and $\omega_d$ define the frequency band of the notch, and the damping ratios $\delta_n$ and $\delta_d$ define the damping rate of the zeros and poles.

In one embodiment, a change in ambient temperature may change the response of the closed loop control system (e.g., cause a shift of a resonant frequency) requiring a corresponding adjustment to the notch filter(s). For example, in one embodiment the effect of ambient temperature on a resonant frequency may be based on a predetermined function, such as a linear function or any other suitable polynomial. Accordingly by measuring a delta temperature between the calibration temperature of the calibration filter and a target temperature, the corresponding change to the resonant frequency (and adjustment to the continuous-time transfer function of the calibration notch filter such as in FIG. 3A) may be computed. Once the adjustment to the continuous-time transfer function of the calibration notch filter has been computed, in one embodiment the continuous-time transfer function is transformed into a discrete-time transfer function that may be implemented using a digital notch filter.

Any suitable technique may be employed to transform the continuous-time transfer function such as shown in FIG. 3A into a discrete-time transfer function, such as a Bilinear, zero-order hold, impulse variation discretization, or zero-pole matching method. For example, the zero-pole matching method may be used to transform the continuous-time transfer function of FIG. 3A into the discrete-time transfer function of FIG. 3B by solving for the roots of the numerator and denominator shown in FIG. 3C. A computational solution to the roots is shown in FIG. 3D, with a corresponding gain computation for the discrete-time transfer function shown in FIG. 3E. In the equations of FIGS. 3C and 3D:

$$z=e^{sT}$$

where T represents the sample rate of the discrete-time transfer function.

Figure 4A:
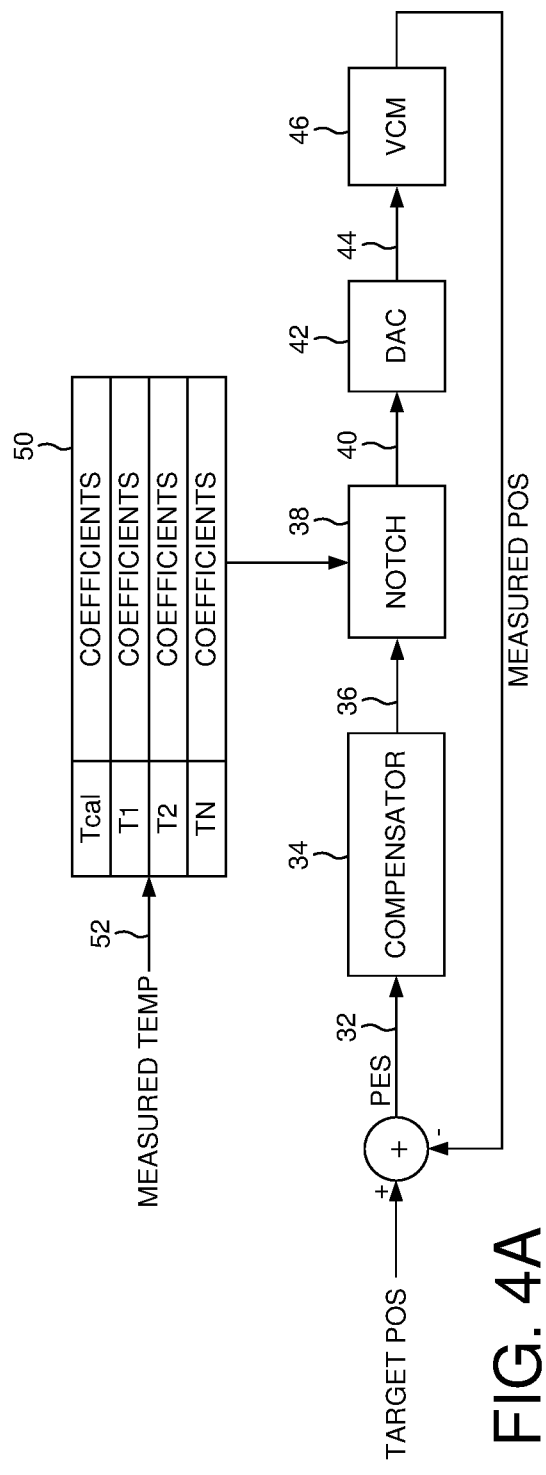
FIG. 4A show an embodiment wherein coefficients for a number of notch filters are computed for a number of different temperatures, and the notch filter in the closed loop control system is configured by selecting the coefficients corresponding to a measured temperature of the disk drive.

FIG. 4A shows an embodiment wherein the notch filter 38 is configured based on a coefficient table 50 indexed by the measured temperature 52. The first entry in the table stores the calibrated coefficients of the calibration notch filter and the corresponding calibration temperature Tcal. The remaining entries in the table store the computed coefficients for the notch filter and a corresponding temperature (T1, T2 ... TN) at which the coefficients are computed. That is for each delta temperature (e.g., Tcal–T1), the coefficients of the notch filter are computed as described above by transforming the corresponding continuous-time transfer function into the discrete-time transfer function. In one embodiment, the coefficient table 50 is generated for each head so that the notch filter 38 is configured based on the active head and the measured temperature 52. In one embodiment, during normal operation the temperature of the disk drive is measured and the coefficients for the notch filter that were computed at a temperature closest to the measured temperature are selected from the coefficient table 50 and used to configure the notch filter 38.

Figure 4B:
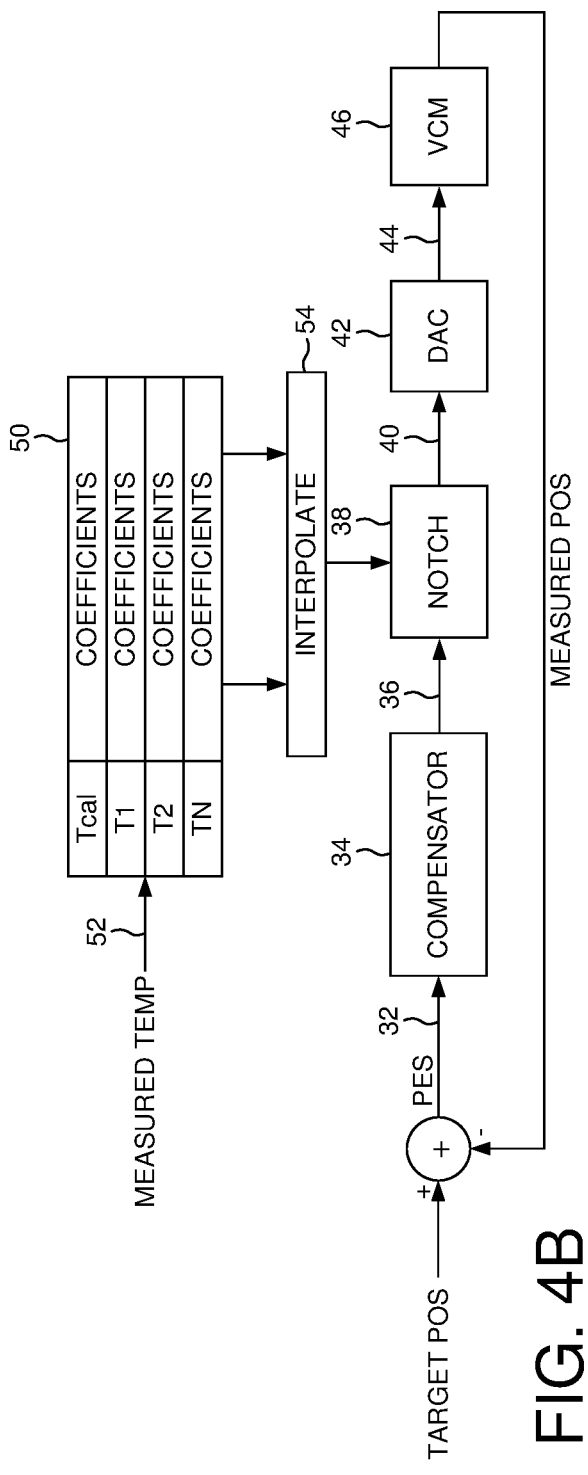
FIG. 4B shows an embodiment wherein the coefficients of the notch filter for a measured temperature are computed on-the-fly by interpolating the pre-computed coefficients.

FIG. 4B shows an embodiment wherein the measured temperature 52 is used to select two sets of coefficients computed at the two temperatures closest to the measured temperature 52, and the coefficients for the notch filter 38 are generated by interpolating 54 the selected set of coefficients. In one embodiment, the interpolated coefficients are generated on-the-fly for the notch filter 38 when the measured temperature 52 changes, or when the active head switches in order to access a different disk surface. Interpolating a predetermined set of coefficients on-the-fly reduces the number of coefficients that need to be computed and stored in the coefficient table 50.

Figure 5A:
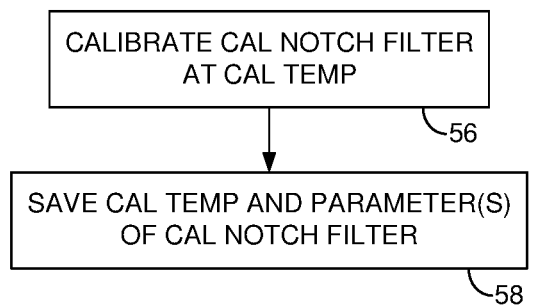
FIG. 5A shows a flow diagram according to an embodiment wherein a notch filter is calibrated at a calibration temperature during a manufacturing procedure, and the calibrated temperature and parameter(s) of the calibrated notch filter are saved.
Figure 5B:
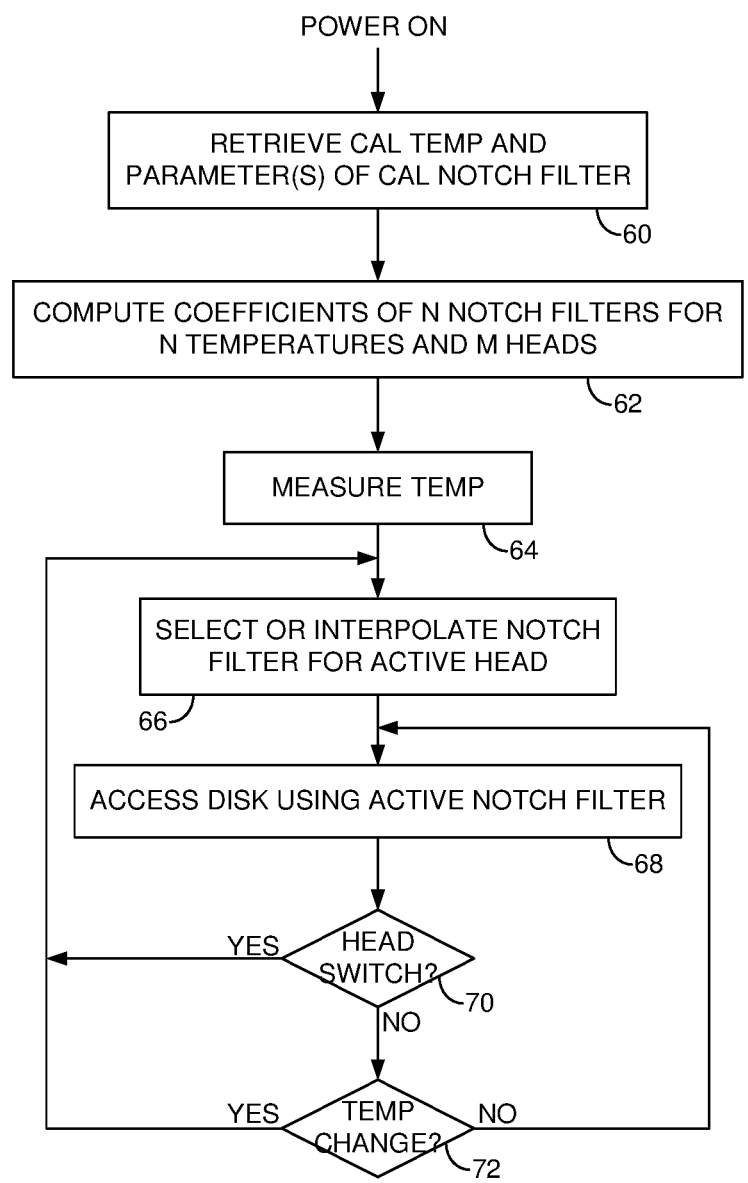
FIG. 5B is a flow diagram according to an embodiment wherein when the disk drive is powered on, the coefficients of multiple notch filters for multiple temperatures are computed across multiple heads and used to configure the notch filter of the closed loop control system while accessing different disk surfaces at different temperatures.

FIG. 5A is a flow diagram executed during a manufacturing procedure according to an embodiment wherein the parameters of the calibration notch filter (e.g., the parameters $\omega_n$, $\omega_d$, $\delta_n$ and $\delta_d$ in the continuous-time transfer function shown in FIG. 3A) are calibrated at a calibration temperature (block 56). The calibration temperature and at least one of the calibrated parameters of the calibration notch filter are stored in a non-volatile memory, such as on the disk 18 or in a non-volatile semiconductor memory (e.g., Flash memory) (block 58). FIG. 5B is a flow diagram according to an embodiment that is executed during a power on process of the disk drive while deployed in the field. The calibration temperature and the calibrated parameter(s) of the calibration notch filter are retrieved from the non-volatile memory (block 60), and a set of N coefficients for N notch filters are computed for each of N target temperatures and for each of M heads (block 62) as described above. During normal operation, a temperature of the disk drive is measured (block 64) and used to select (or interpolate) the coefficients of the notch filter for the active head (block 66). The disk surface for the active head is then accessed using the closed loop control system of FIG. 2C, including the configured notch filter. When the active head changes (block 70), or when the measured temperature changes (block 72), the coefficients of the notch filter are reconfigured at block 66.

In one embodiment, the temperature sensitivity of the closed loop control system may be predetermined, for example, by measuring the temperature sensitivity of a number of disk drives and then generating a nominal function for computing the temperature effect on the continuous-time transfer function of the notch filter such as shown in FIG. 3A. In another embodiment, the temperature sensitivity of the closed loop control system may be measured for each disk drive, for example, in a temperature controlled environment during a manufacturing procedure. For example, in one embodiment the control circuitry may measure a peak in an error rejection curve of the closed loop control system in order to identify a resonant frequency. The control circuitry may measure the peak in the error rejection curve at multiple temperatures in order to establish the mathematical relationship between temperature and the effect on the continuous-time transfer function of the notch filter such as shown in FIG. 3A.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry. In some embodiments, at least some of the flow diagram blocks may be implemented using analog circuitry (e.g., analog comparators, timers, etc.), and in other embodiments at least some of the blocks may be implemented using digital circuitry or a combination of analog/digital circuitry.

In various embodiments, a disk drive may include a magnetic disk drive, an optical disk drive, a hybrid disk drive, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
   a disk;
   a head actuated over the disk; and
   control circuitry configured to:
   calibrate a first notch filter at a first temperature; and
   compute a second notch filter for a second temperature based on the first notch filter and a first delta temperature between the first temperature and the second temperature,
   wherein the second notch filter is computed by transforming a continuous-time transfer function of the first notch filter adjusted by the first delta temperature into a discrete-time transfer function of the second notch filter.

2. The data storage device as recited in claim 1, wherein the control circuitry is further configured to:
   measure a temperature of the data storage device;
   select between the first notch filter and the second notch filter based on the measured temperature; and
   actuate the head over the disk using the selected notch filter.

3. The data storage device as recited in claim 1, wherein the control circuitry is further configured to:
   measure a temperature of the data storage device;
   compute a third notch filter by interpolating at least one coefficient of the first notch filter and the second notch filter based on the measured temperature; and
   actuate the head over the disk using the third notch filter.

4. The data storage device as recited in claim 1, wherein the control circuitry is further configured to:
   compute a shift of a center frequency of the first notch filter due to the delta temperature; and
   compute the second notch filter based on the shift of the center frequency.

5. The data storage device as recited in claim 1, wherein the control circuitry is further configured to:
   calibrate the first notch filter during a manufacturing procedure; and
   compute the second notch filter during a power-on procedure.

6. The data storage device as recited in claim 1, wherein:
the control circuitry is further configured to compute a third notch filter for a third temperature based on the first notch filter and a second delta temperature between the first temperature and the third temperature; and
the third notch filter is computed by transforming a continuous-time representation of the first notch filter adjusted by the second delta temperature into a discrete-time representation of the third notch filter.

7. A data storage device comprising:
a disk;
a head actuated over the disk; and
control circuitry configured to:
  calibrate a first notch filter at a first temperature;
  compute a second notch filter based on a center frequency shift of the first notch filter due to a first temperature delta between the first temperature and a second temperature,
  wherein the second notch filter is computed by transforming a continuous-time transfer function of the first notch filter adjusted by the first delta temperature into a discrete-time transfer function of the second notch filter.

8. The data storage device as recited in claim 7, wherein the control circuitry is further configured to:
measure a temperature of the disk drive;
select between the first notch filter and the second notch filter based on the measured temperature; and
actuate the head over the disk using the selected notch filter.

9. The data storage device as recited in claim 7, wherein the control circuitry is further configured to:
measure a temperature of the disk drive;
compute a third notch filter by interpolating at least one coefficient of the first notch filter and the second notch filter based on the measured temperature; and
actuate the head over the disk using the third notch filter.

10. The data storage device as recited in claim 7, wherein the control circuitry is further configured to:
calibrate the first notch filter during a manufacturing procedure; and
compute the second notch filter during a power-on procedure.

11. The data storage device as recited in claim 7, wherein:
the control circuitry is further configured to compute a third notch filter based on a center frequency shift of the first notch filter due to a second temperature delta between the first temperature and a third temperature; and
the third notch filter is computed by transforming a continuous-time representation of the first notch filter adjusted by the second delta temperature into a discrete-time representation of the third notch filter.

12. A data storage device comprising:
a disk;
a head actuated over the disk; and
a means for calibrating a first notch filter at a first temperature; and
a means for computing a second notch filter for a second temperature based on the first notch filter and a delta temperature between the first temperature and the second temperature.

13. The data storage device as recited in claim 12, further comprising:
a means for measuring a temperature of the data storage device;
a means for selecting between the first notch filter and the second notch filter based on the measured temperature; and
a means for actuating the head over the disk using the selected notch filter.

14. The data storage device as recited in claim 12, further comprising:
a means for measuring a temperature of the data storage device;
a means for computing a third notch filter by interpolating at least one coefficient of the first notch filter and the second notch filter based on the measured temperature; and
a means for actuating the head over the disk using the third notch filter.

15. The data storage device as recited in claim 12, further comprising:
a means for computing a shift of a center frequency of the first notch filter due to the delta temperature; and
a means for computing the second notch filter based on the shift of the center frequency.

16. The data storage device as recited in claim 12, further comprising:
a means for calibrating the first notch filter during a manufacturing procedure; and
a means for computing the second notch filter during a power-on procedure.

17. The data storage device as recited in claim 12, further comprising a means for computing a third notch filter for a third temperature based on the first notch filter and a delta temperature between the first temperature and the third temperature.

* * * * *